(12) United States Patent
Meterelliyoz et al.

(10) Patent No.: US 7,920,434 B2
(45) Date of Patent: Apr. 5, 2011

(54) MEMORY SENSING METHOD AND APPARATUS

(75) Inventors: Mesut Meterelliyoz, West Lafayette, IN (US); John Edward Barth, Jr., Williston, VT (US); William Robert Reohr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 12/199,438

(22) Filed: Aug. 27, 2008

(65) Prior Publication Data

US 2010/0054057 A1 Mar. 4, 2010

(51) Int. Cl.
*G11C 5/00* (2006.01)
(52) U.S. Cl. .................................... 365/203; 365/226
(58) Field of Classification Search .................. 365/205, 365/207, 208, 203
See application file for complete search history.

(56) References Cited

U.S. PATENT DOCUMENTS

| | | | |
|---|---|---|---|
| 5,062,079 A | 10/1991 | Tsuchida et al. | |
| 6,147,917 A | 11/2000 | Brady | |
| 6,456,521 B1 | 9/2002 | Hsu et al. | |
| 6,590,800 B2 | 7/2003 | Chang | |
| 6,721,222 B2 | 4/2004 | Somasekhar et al. | |
| 7,099,216 B2 | 8/2006 | Luk et al. | |
| 2005/0030817 A1* | 2/2005 | Luk et al. | 365/226 |
| 2007/0030741 A1 | 2/2007 | Nii et al. | |
| 2007/0257313 A1 | 11/2007 | Hidaka et al. | |
| 2008/0175083 A1* | 7/2008 | Barth | 365/208 |

OTHER PUBLICATIONS

J. Barth et al., "A 500 MHz Random Cycle, 1.5 ns Latency, SOI Embedded DRAM Macro Featuring a Three-Transistor Micro Sense Amplifier," IEEE Journal of Solid-State Circuits, Jan. 2008, pp. 86-93, vol. 43, No. 1.
B.F. Cockburn et al., "A Multilevel DRAM with Hierarchical Bitlines and Serial Sensing," International Workshop on Memory Technology, Design and Testing, Jul. 2003, pp. 14-19.
J.-S. Kim et al., "A Low-Noise Folded Bit-Line Sensing Architecture for Multigigabit DRAM with Ultrahigh-Density 6F2 Cell," IEEE Journal of Solid-State Circuits, Jul. 1998, pp. 1096-1102, vol. 33, No. 7.
K.-H. Kyung et al., "A 2.5V, 2.0Gbyte/s 288M Packet-Based DRAM with Enhanced Cell Efficiency and Noise Immunity," Symposium on VLSI Circuits Digest of Technical Papers, Jun. 2000, pp. 112-115.
D.-S. Min et al., "Multiple Twisted Data Line Techniques for Coupling Noise Reduction in Embedded DRAMs," IEEE Custom Integrated Circuits Conference, May 1999, pp. 231-234.
D.-S. Min et al., "Wordline Coupling Noise Reduction Techniques for Scaled DRAMs," Symposium on VLSI Circuits Digest of Technical Papers, Jun. 1990, pp. 81-82.

(Continued)

*Primary Examiner* — Hoai V Ho
*Assistant Examiner* — James G Norman
(74) *Attorney, Agent, or Firm* — Preston J. Young; Ryan, Mason & Lewis, LLP

(57) ABSTRACT

Techniques for sensing data states of respective memory cells in a memory array are provided, the memory array including at least a first bit line coupled to at least a subset of the memory cells. In one aspect, a circuit for sensing data states of respective memory cells in the memory array includes at least one sense amplifier coupled to the first bit line. The sense amplifier includes a first transistor operative to selectively inhibit charging of the first bit line in a manner which is independent of a voltage level on a second bit line coupled to the sense amplifier.

22 Claims, 9 Drawing Sheets

OTHER PUBLICATIONS

Y. Nakagome et al., "The Impact of Data-Line Interference Noise on DRAM Scaling," IEEE Journal of Solid-State Circuits, Oct. 1988, pp. 1120-1127, vol. 23, No. 5.

Y. Oowaki et al., "A 33-ns. 64-Mb DRAM," IEEE Journal of Solid-State Circuits, Nov. 1991, pp. 1498-1505, vol. 26, No. 11.

R. Takemura et al., "A 0.5-V FD-SOI Twin-Cell Dram with Offset-Free Dynamic-VT Sense Amplifiers," International Symposium on Low Power Electronics and Design, Oct. 2006, pp. 123-126.

H. Tanaka et al., "A Precise On-Chip Voltage Generator for a Gigascale DRAM with a Negative Word-Line Scheme," IEEE Journal of Solid-State Circuits, Aug. 1999, pp. 1084-1090, vol. 34, No. 8.

S. Utsugi et al., "Non-Complimentary Rewriting and Serial-Data Coding Scheme for Shared-Sense-Amplifier Open-Bit-Line DRAMs," Symposium on VLSI Circuits Digest of Technical Papers, Jun. 1998, pp. 18-21.

J.S. Yuan et al., "Parasitic Capacitance Effects of the Multilevel Interconnects in DRAM Circuits," IEEE Seventh International VLSI Multilevel Interconnection Conference, Jun. 1990, pp. 410-412.

* cited by examiner

100

200

300

1000

1100

1200

1300

MEMORY SENSING METHOD AND APPARATUS

STATEMENT OF GOVERNMENT RIGHTS

This invention was made with Government support under Contract No. HR0011-07-9-0002 awarded by the Defense Advanced Research Projects Agency (DARPA) of the United States Department of Defense. The Government has certain rights in this invention.

FIELD OF THE INVENTION

The present invention relates generally to the electrical, electronic, and computer arts, and more particularly relates to data sensing in an integrated circuit (IC) memory.

BACKGROUND OF THE INVENTION

A dynamic random access memory (DRAM) memory cell typically includes a storage capacitor and an access transistor coupled to the storage capacitor. The physical data state, a logic "1" or "0," stored in the memory cell corresponds to the electric charge held within the capacitor of the cell. The access transistor functions as a switch through which charge is transferred between the memory cell and the corresponding local bit line to which the memory cell is connected during a read, write or refresh operation. The operation of DRAM memory is well known in the art.

A DRAM macro, including embedded DRAM (eDRAM), typically includes, not only DRAM memory cells but also a plurality of storage, sensing and data path circuits, on-pitch column circuitry, on-pitch row circuitry, control circuitry, data-in inputs, data-out outputs, address inputs, and control inputs. Each storage, sensing and data path circuit typically comprises at least one sense amplifier.

A sense amplifier having a lower transistor count was developed that would support fewer corresponding memory cells without impacting area efficiency of the DRAM macro (See, e.g., J. Barth et al., "A 500 MHz Random Cycle, 1.5 ns Latency, SOI Embedded DRAM Macro Featuring a Three-Transistor Micro Sense Amplifier," *IEEE Journal of Solid-State Circuits*, Vol. 43, No. 1, January 2008). Fewer cells lighten the bit line load and, hence, improve the time constant associated with reading the memory cells. This new and fast sense amplifier is known as a micro sense amplifier (μSA). Eight of these μSAs may be employed, for example, in one storage, sensing and data path circuit. During a read, write, or refresh cycle, only one μSA for each bit line group within each storage, sensing and data path circuit is active; that is, within each storage, sensing and data path circuit, only one μSA associated with each bit line group is involved in detecting, writing or refreshing a stored data state within a memory cell. The remaining μSAs for each bit line group are inactive; that is, they are not involved in detecting, writing or refreshing a stored data state within a memory cell. In this arrangement, there are typically a plurality of memory cells coupled to a given local bit line (LBL), which are, in turn, coupled to one μSA.

The conventional μSA is sensitive to noise and process variations. These effects not only degrade noise immunity of the μSA, but also may, in some cases, lead to erroneous read operations. Typically, the noise sensitivity of the μSA limits the number of cells that can be associated with one μSA and still maintain adequate signal margins. Consequently, the area efficiency of such a DRAM macro is limited because more of the fractional area must be devoted to peripheral circuits (e.g., μSA) and less to memory cells, which is undesirable.

SUMMARY OF THE INVENTION

Illustrative embodiments of the present invention provide techniques for better detecting a stored datum state within a memory cell. Advantages of the invention include, for example, improved and faster sensing of stored data in DRAM, and density and speed improvement in embedded cache memories within processors. Additionally, techniques of the invention beneficially provide improved immunity of the sense amplifier to variations in process, voltage, and/or temperature conditions to which the sense amplifier may be subjected.

In accordance with one aspect of the invention, a circuit for sensing data states of respective memory cells in a memory array is provided, the memory array including at least a first bit line coupled to at least a subset of the memory cells. The circuit includes at least one sense amplifier coupled to the first bit line. The sense amplifier includes a first transistor operative to selectively inhibit charging of the first bit line in a manner which is independent of a voltage level on a second bit line coupled to the sense amplifier. The first transistor preferably includes a first source/drain adapted for connection to a first voltage supply, and a gate adapted to receive a first control signal. Assertion of the first control signal is preferably delayed from assertion of a word line signal corresponding to the selected memory cell. The circuit for sensing data states of respective memory cells in a memory array may be implemented in an IC including one or more of such circuits.

In accordance with another aspect of the invention, a circuit for sensing data states of respective memory cells in a memory array is provided, the memory array including at least a first bit line coupled to at least a subset of the memory cells. The circuit includes at least one sense amplifier coupled to the first bit line and to second and third bit lines in the memory array. The sense amplifier includes at least first and second transistors coupled together in series between the second and third bit lines and being operative to enable a read operation of a selected one of the memory cells. The first and second transistors are further operative to inhibit leakage current from flowing between the second and third bit lines during a read operation.

In accordance with yet another aspect of the invention, a method for sensing data states of respective memory cells in a memory array is provided, the memory array including at least a first bit line coupled to at least a subset of the memory cells. The method includes the steps of: enabling a given one of the memory cells by asserting a word line coupled to the given memory cell, wherein the given memory cell is coupled to the first bit line and to at least a first sense amplifier; inhibiting charging of the first bit line in a manner which is independent of a voltage level on a second bit line coupled to the at least one sense amplifier; and activating the at least one sense amplifier to detect a data state of the given memory cell.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a sense amplifier and method for detecting the state of data stored in a memory cell, and a memory array in which the sense amplifier and method may be employed. It is to be appreciated, however, that the techniques of the present invention are not limited to the specific circuits and method shown and described herein. Rather, embodiments of the invention are directed broadly to improved techniques for sensing the data state of a memory cell in a manner which increases immunity to noise generated within the memory array and without significantly increasing the size of the sense amplifier. For this reason, numerous modifications can be made to these embodiments and the results will still be within the scope of the invention. No limitations with respect to the specific embodiments described herein are intended or should be inferred.

The term WRITE-0, as used herein, is intended to refer broadly to an operation of writing a binary "0" data state. The term WRITE-1, as used herein, is intended to refer broadly to an operation of writing a binary "1" data state. The term READ-0, as used herein, is intended to refer broadly to an operation of reading a binary "0" data state. The term READ-1, as used herein, is intended to refer broadly to an operation of reading a binary "1" data state. The term "0" data state, as used herein, is intended to refer broadly to a logic low data state, a ground data state, or a negative data state. The term "1" data state, as used herein, is intended to refer broadly to a logic high data state, a VDD data state, or a positive data state. The term low, as used herein with reference to a voltage, is intended to refer broadly to a low voltage supply level, for example, approximately zero volts or ground potential. The term high, as used herein with reference to a voltage, is intended to refer broadly to a high voltage supply level, for example, VDD (e.g., about 1.0 volt). It is to be understood that the invention is not limited to any particular voltage levels employed to define logic high and low data states.

Figure 1:
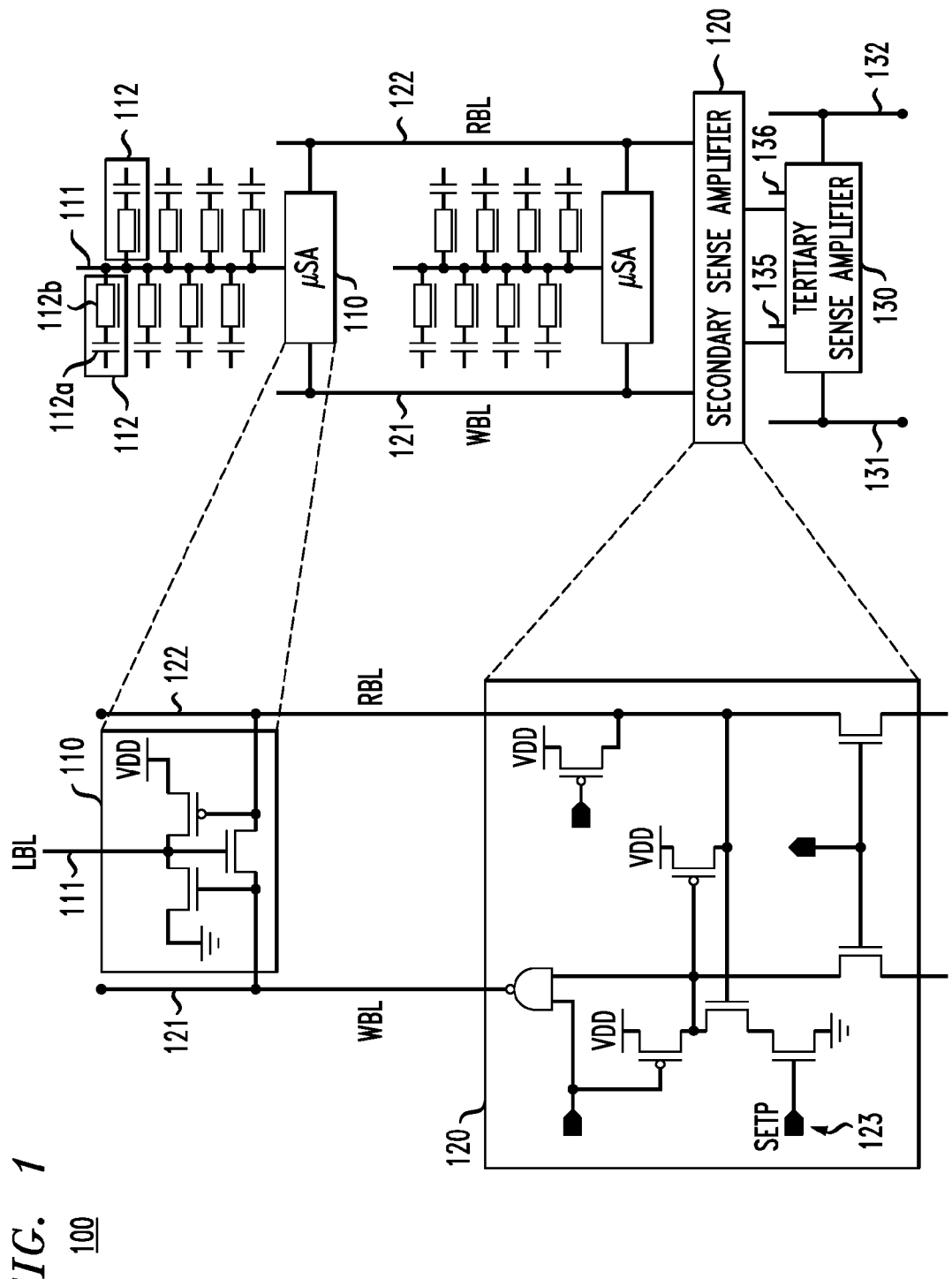
FIG. 1 depicts at least a portion of an exemplary DRAM storage, sensing and data path circuit, in which techniques of the present invention may be employed.

FIG. 1 depicts at least a portion of an exemplary DRAM storage, sensing and data path circuit 100 in which techniques of the invention can be employed. Storage, sensing and data path circuit 100 preferably includes a plurality of μSAs 110, each μSA being connected to a corresponding local bit line (LBL) 111, write bit line (WBL) 121 and read bit line (RBL) 122. While each μSA 110 is connected to a single LBL 111, there may be multiple μSAs and corresponding LBLs (e.g., eight) connected to a given pair of WBL 121 and RBL 122, as shown. It is to be understood that the invention is not limited to any specific number of μSAs 110 and LBLs 111 connected to given pair of WBL 121 and RBL 122. Typically, a memory macro is comprised of a number of storage, sensing and data path circuits 100, for example, 4096, although the invention is not limited to any particular number of storage, sensing and data path circuits.

There are a number of memory cells 112 coupled to a given LBL 111 (e.g., thirty-two cells), although the invention is not limited to any particular number of cells that may be connected to a corresponding LBL. Each memory cell 112 preferably includes a storage capacitor 112a, or alternative storage element, for storing the data state of the cell, and a transistor 112b, or alternative access device, coupled to the storage capacitor and operative to control access to the memory cell. Transistor 112b is preferably a metal-oxide-semiconductor (MOS) device having a source connected to a first terminal of the capacitor 112a, a drain coupled to the corresponding LBL 111, and a gate adapted to receive a control signal for selectively accessing the memory cell. A second terminal of the storage capacitor 112a is connected to ground, or an alternative voltage source (e.g., VDD). Respective control signals for selectively accessing the memory cells in the storage, sensing and data path circuit 100 may be generated by, for example, row and/or column circuitry (not explicitly shown) included in the DRAM circuit (e.g., row address demultiplexer).

It is to be appreciated that, because a MOS device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

The memory macro preferably employs single-ended sensing using a hierarchy of sense amplifiers. To accomplish this, storage, sensing and data path circuit 100 preferably further includes a plurality of secondary sense amplifiers (SSAs) 120, each SSA being coupled to a corresponding pair of WBL 121 and RBL 122. Storage, sensing and data path circuit 100 may even include a plurality of tertiary (or more) sense amplifiers 130, each tertiary sense amplifier (TSA) being operatively coupled to the secondary sense amplifier 120 associated with a corresponding pair of WBL 121 and RBL 122. TSA 130 selectively connects global bit lines 131 and 132 to one of a plurality of SSAs, each connecting to a RBL 122 and WBL 121 pair having associated μSAs and memory cells. Multiple wire connections 135 and 136 are intended to express the existence of the plurality of SSAs and their associated circuitry. Pass transistors within the SSA 120, when operatively coupled to other SSAs, form a multiplexer for read operations and/or a demultiplexer for write operations. A write driver 140 coupled to the corresponding pair of a global bit line true 131 and a global bit line compliment 132 is operative to generate control signals, etc., for reading and writing memory cells coupled to a corresponding pair of WBL 121 and RBL 122.

Figure 2:
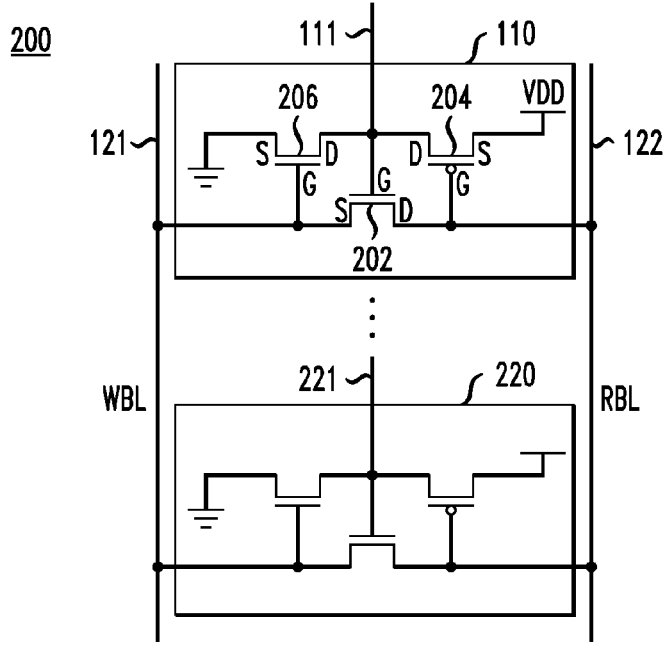
FIG. 2 is a schematic diagram depicting illustrative three-transistor micro sense amplifiers, which may be employed in the DRAM storage, sensing and data path circuit shown in FIG. 1.

As apparent from the figure, each of the μSAs 110 employed in circuit 100 comprises three MOS transistors, and may therefore be referred to as a three-transistor (3T) μSA. The initial data sensing is performed using the 3T μSAs 110. FIG. 2 is a schematic diagram depicting illustrative 3T μSAs, 110 and 220, which may be employed in the DRAM storage, sensing and data path circuit 100 shown in FIG. 1. As shown in FIG. 2, a given 3T μSA 110 comprises a first N-channel MOS (NMOS) transistor device 202, which may be a READ transistor, a P-channel MOS (PMOS) transistor device 204, which may be a WRITE-1 transistor, and a second NMOS transistor device 206, which may be a WRITE-0 transistor. NMOS transistor device 206 also serves to precharge LBL 111. First NMOS device 202 includes a source (S) adapted for connection to corresponding WBL 121, a drain (D) adapted for connection to corresponding RBL 122, and a gate (G) adapted for connection to corresponding LBL 111. PMOS device 204 includes a source adapted for connection to VDD, or an alternative voltage supply, a drain connected to the gate of NMOS device 202, and a gate connected to the drain of NMOS device 202. Second NMOS device 206 includes a source adapted for connection to ground, or an alternative voltage return or voltage source, a drain connected to the gate of NMOS device 202, and a gate connected to the source of NMOS device 202. READ-transistor 202 enables a READ operation, while WRITE-0 transistor 206 and WRITE-1 transistor 204 enable WRITE-0 and WRITE-1 operations, respectively. Multiple μSAs 110 and 220, each having a corresponding LBL 111 and 221, respectively, associated therewith, are preferably connected in parallel with one another so as to share the same RBL 122 and WBL 121, as shown.

The standby and write operation of the 3T μSA 110 can be summarized as follows. During standby, both RBL 122 and WBL 121 are precharged high; that is, precharged to a high voltage level, such as, for example, one volt. It is to be understood that, while the invention is not limited to any specific voltage potential for defining a logic high value, the voltage level should be greater than or equal to a threshold voltage level of a MOS transistor. Precharging RBL 122 and WBL 121 high will turn on NMOS device 206 and turn off PMOS device 204, thereby precharging LBL III to a low voltage level (e.g., ground or zero volt) via device 206. For a WRITE-1 operation, both RBL 122 and WBL 121 are driven to a low voltage level, thereby turning off device 206 and turning on device 204. The memory storage capacitor 112a of a given memory cell 112 coupled to LBL 111 is charged to a high voltage potential (e.g., VDD) through transistor 204 and the LBL 111. For a WRITE-0 operation, the RBL 122 is kept at a high voltage level and the WBL 121 is driven high, thereby turning on device 206 and turning off device 204. In this manner, the storage capacitor 112a of the memory cell 112 is discharged to approximately ground potential (e.g., zero volt) through the LBL 111 and NMOS transistor 206.

During a READ operation, after precharging RBL 122 and WBL 121 high, which forces LBL 111 to a low voltage level, WBL 121 is driven to a low voltage level, thereby turning off NMOS device 206 and allowing the LBL 111 to float at approximately ground potential; that is, LBL 111 is in a high impedance state but at approximately ground potential. During a read or write operation, RBL 122 is allowed to float at a high level until the datum state is determined. In the case of a READ-1 operation, a selected memory cell 112 shares charge from the storage capacitor 112a of the cell with LBL 111. This causes the voltage on LBL 111 to rise. When the voltage level on LBL 111 exceeds a transistor threshold voltage level (e.g., about 0.3 volt), NMOS transistor 202 turns on, thereby discharging RBL 122 (previously precharged to a high voltage level) towards ground potential. As RBL 122 discharges to about a transistor threshold voltage below the high voltage level (e.g., VDD−VTP, where VTP is a PMOS transistor threshold voltage), PMOS transistor 204 will turn on and charge LBL III completely to the high voltage supply (e.g., VDD). Initiating positive feedback via NMOS transistor 202 and PMOS transistor 204 accelerates the discharge of RBL 122 and the charging of the selected memory cell 112 back to a high voltage level, hence refreshing the original logic "1" state.

Likewise, during a READ-0 operation, LBL 111 ideally remains at approximately ground potential; that is, LBL 111 remains approximately at the precharge voltage level after sharing charge with the storage capacitor 112a in the selected memory cell 112. Therefore, RBL 122 is not actively discharged through NMOS transistor 202, and, hence, would ideally remain at a high level. With reference to FIG. 1, once control signal SETP 123 presented to the corresponding secondary sense amplifier 120 becomes active (e.g., high voltage level), the secondary sense amplifier 120 pulls WBL 121 high, which, in turn, will discharge LBL 111 to approximately ground potential through NMOS transistor 206, if LBL 111 had previously drifted or otherwise had been coupled or moved to above ground potential. A logic "0" state is therefore restored within the memory cell 112. It is also important to recognize that RBL should stay high—it initially floats during a read or write operation—until SETP becomes active for a correct READ-0 operation to be registered.

One disadvantage of the 3T μSA 110 is that, during a READ-0 operation, positive feedback between transistor 202 and transistor 204 can inadvertently change the state of the stored data from a logical "0" state to a logical "1" state. Under normal conditions, LBL 111 should stay low and RBL 122 should stay high for a long period of time for a successful READ-0 operation to occur, until SETP becomes active. However, under certain conditions (e.g., process, voltage and/or temperature (PVT) variations), an unwanted rise in voltage on the LBL 111 or an unwanted drop in voltage on the RBL 122 might initiate the positive feedback by turning on transistor 202 or transistor 204. As a result, RBL 122 will be fully discharged and an erroneous read operation will occur. Initiating and/or contributing to an erroneous READ-0 operation can be noise injected onto RBL 122 and onto LBL 111 and variations in PVT conditions to which the circuit is subjected.

An important cause of errors in this 3T μSA is the intrinsic threshold voltage mismatch in its transistors (e.g. NMOS transistor 202 and PMOS transistor 204). As shown in FIG. 2, there may be multiple 3T μSAs 110 connected between the same RBL 122 and WBL 121. Having multiple 3T μSAs 110 connected between the same pair of RBL 122 and WBL 121 increases the likelihood of erroneous positive feedback. For all non-active 3T μSAs 110, the corresponding LBL should ideally remain at ground potential initially in order to avoid interruption of the read operation in the active 3T μSA 110. However, due at least in part to the reasons mentioned above, positive feedback can be initiated by any non-active (and active) 3T μSA 110 and can result in erroneous operation of the active 3T μSA 110. Hence, it is beneficial to control and reduce, to the best extent possible, the influence of positive feedback in the 3T μSA 110 in order to increase the robustness of the sense amplifier. Reducing the effect of non-active sense amplifiers on memory operation is therefore highly desirable for improving the density, robustness, signal-to-noise margin and process immunity, among other characteristics, of the eDRAM macro.

Figure 3:
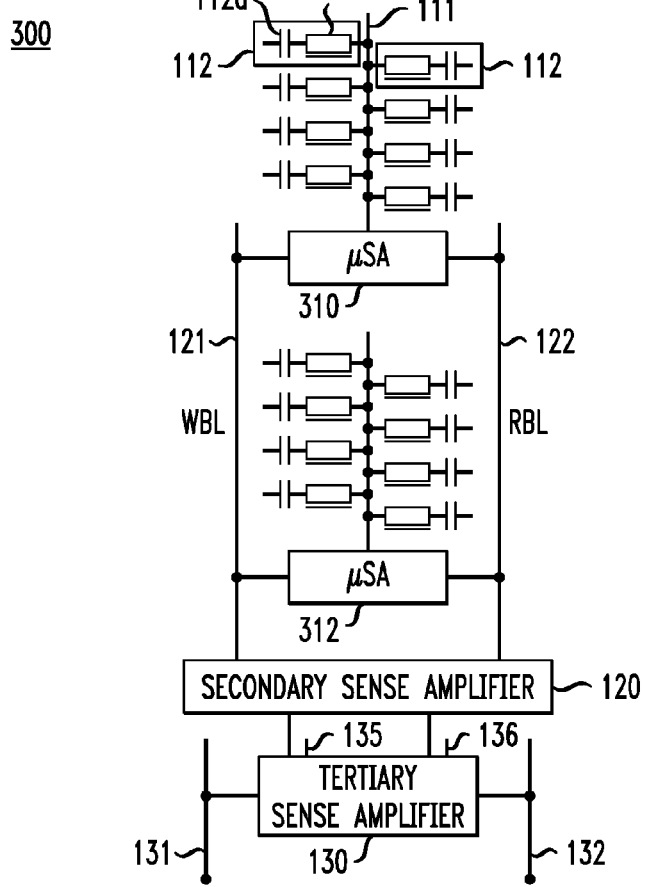
FIG. 3 is a schematic diagram depicting at least a portion of an exemplary DRAM storage, sensing and data path circuit, according to an embodiment of the present invention.

FIG. 3 is a schematic diagram depicting at least a portion of an exemplary DRAM storage, sensing and data path circuit 300, according to an embodiment of the present invention. The storage, sensing and data path circuit 300 comprises a first μSA 310 which is coupled to a corresponding LBL 111 at a first node, and a corresponding pair of WBL 121 and RBL 122 at second and third nodes, respectively. A plurality of memory cells 112 (e.g., 32) are connected to LBL 111, each memory cell including a storage capacitor 112*a*, or alternative storage element, and a corresponding access transistor 112*b*, or alternative access device, connected to the storage element, as previously described. Alternative memory cell arrangements are contemplated by the invention. It is to be appreciated that the invention is not limited to any specific number of memory cells connected to a given LBL.

As with the illustrative DRAM storage, sensing and data path circuit 100 shown in FIG. 1, DRAM storage, sensing and data path circuit 300 may include at least a second μSA 312 coupled to the same pair of WBL 121 and RBL 122 as first μSA 310, with μSA 312 being coupled to its own LBL and corresponding memory cells connected thereto. Circuit 300 preferably further comprises a SSA 120 coupled to the pair of WBL 121 and RBL 122, a TSA 130 coupled to the SSA 120 and to a pair of true and complement global bit lines, 131 and 132, respectively, and a write driver 140 coupled to the true and complement global bit line pair 131, 132. In one embodiment, a number of LBLs 111 and μSAs 310, 312 (e.g., 8) may be coupled to a given pair of WBL 121 and RBL 122. Each μSA (e.g., 310) is coupled to one LBL 111 and corresponding set of memory cells 112. It is to be understood that the invention is not limited to any particular number of μSAs and corresponding LBLs associated with a given WBL and RBL pair.

Figure 4:
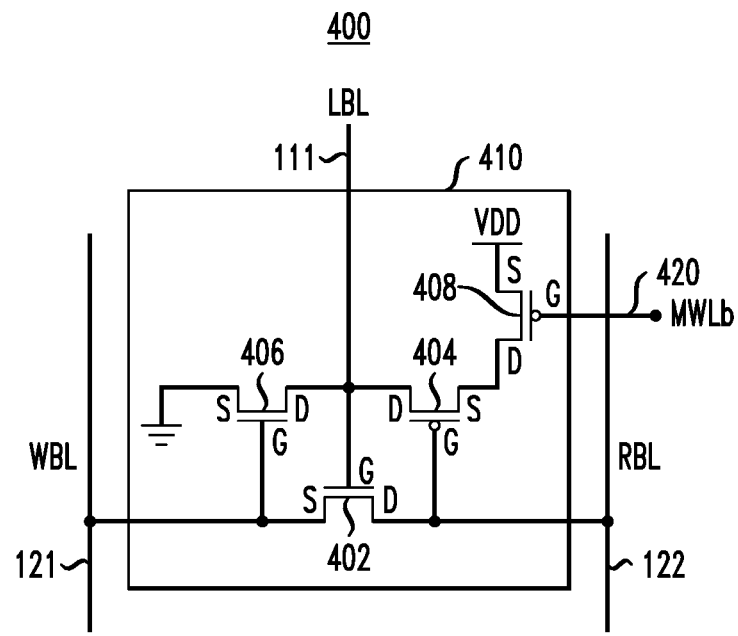
FIG. 4 is a schematic diagram depicting at least a portion of a circuit including an exemplary four-transistor micro sense amplifier, formed in accordance with an embodiment of the present invention.
Figure 5:
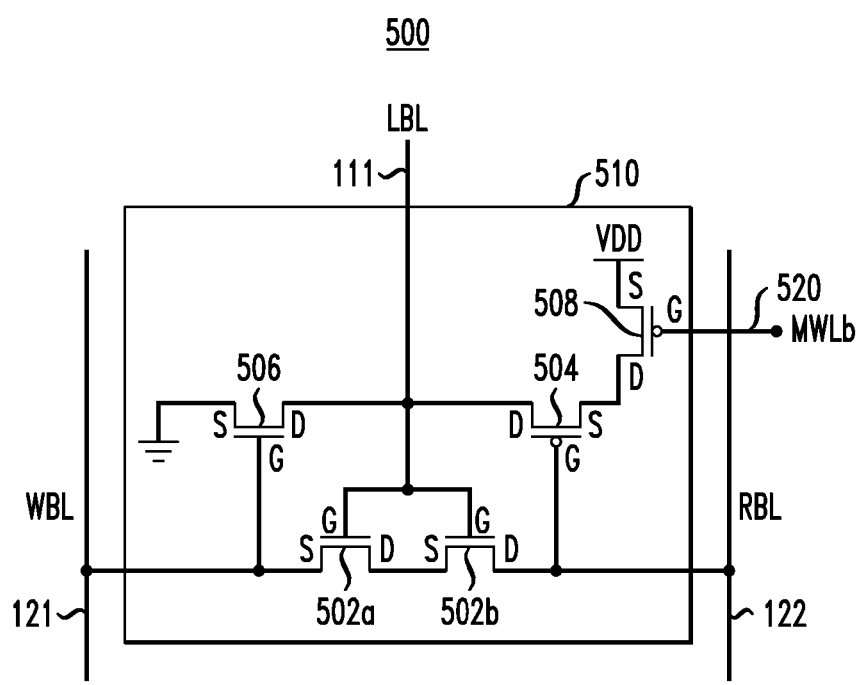
FIG. 5 is a schematic diagram depicting at least a portion of a circuit including an exemplary five-transistor micro sense amplifier, formed in accordance with another embodiment of the present invention.
Figure 6:
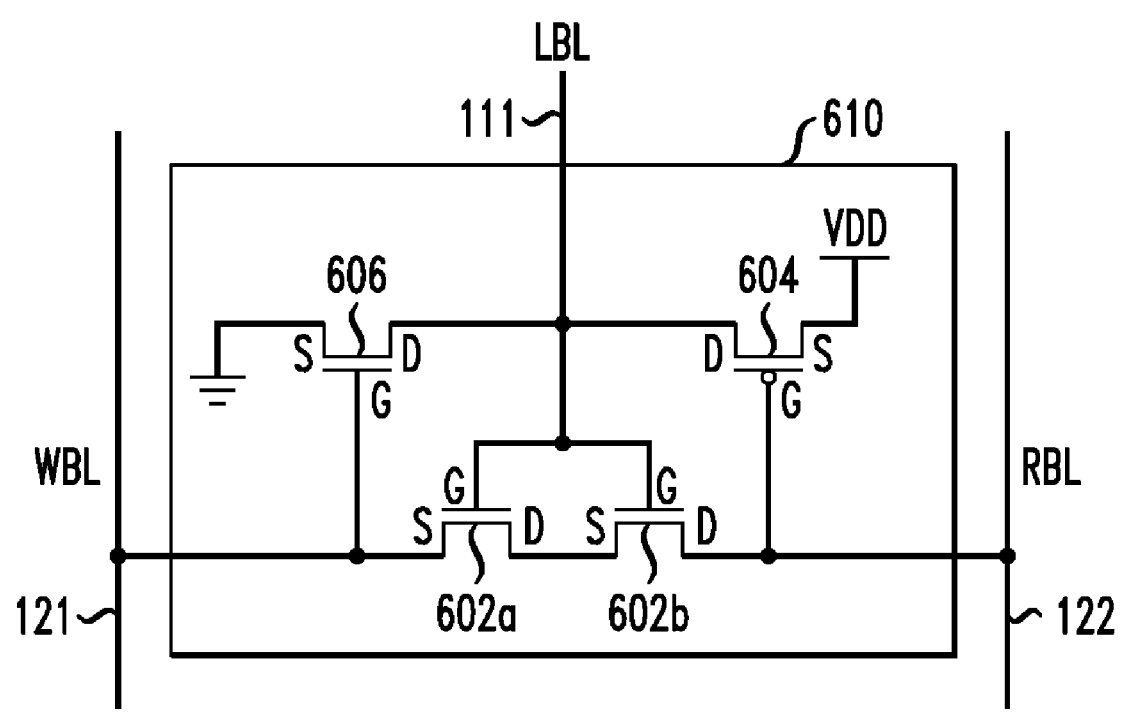
FIG. 6 is a schematic diagram depicting an exemplary four transistor micro sense amplifier, according to yet another embodiment of the present invention.

FIGS. 4 through 6 are schematic diagrams depicting exemplary μSA circuits suitable for use in the storage, sensing and data path circuit 300 shown in FIG. 3. It is to be appreciated that the invention is not limited to the specific circuit arrangements shown.

With reference to FIG. 4, at least a portion of a circuit 400 including an exemplary four-transistor (4T) μSA 410 is shown, according to an embodiment of the invention. As apparent from the figure, the 4T μSA 410 is similar to the 3T μSA 110 depicted in FIG. 2, with the addition of a fourth transistor and corresponding control input. More particularly, 4T μSA 400 comprises a first NMOS transistor 402, which may be a READ transistor, a first PMOS transistor 404, which may be a WRITE-1 transistor, a second NMOS transistor 406, which may be a WRITE-0 transistor, and a second PMOS transistor 408, which may be an ENABLE transistor. Transistor 402 has a source adapted for connection to a corresponding WBL 121, a drain adapted for connection to a corresponding RBL 122, and a gate adapted for connection to a corresponding LBL 111. Transistor 404 has a source connected to a drain of transistor 408, a drain connected to the gate of transistor 402, and a gate connected to the drain of transistor 402. Transistor 406 has a source adapted for connection to ground, or an alternative voltage return, a drain connected to the gate of transistor 402, and a gate connected to the source of transistor 402. Transistor 408 has a source adapted for connection to VDD, or an alternative voltage supply, and a gate forming a control input 420 of the 4T μSA 410, which may be coupled to a master word line, and being adapted to receive a control signal, MWLb, supplied to the control input.

As will be explained in further detail below, ENABLE transistor 408 preferably functions, at least in part, to overcome certain disadvantages attributable to implementing positive feedback between the READ and WRITE-1 transistors (e.g., transistors 202 and 204 in the 3T-μSA 110 shown in FIG. 2), as discussed above. Specifically, transistor 408 is inserted between transistor 404 and the connection to voltage supply VDD. During any memory operation, at most one μSA per RBL and WBL within the storage, sensing and data path circuit (e.g., 300 shown in FIG. 3) in a memory macro is activated at any given time. The 4T μSA 410 is activated by driving the MWLb control input 420 to a low voltage level (e.g., zero volt). The respective control signals MWLb supplied to non-selected 4T μSAs (e.g., 312 in FIG. 3) are kept at a high voltage level to turn off the ENABLE transistors 408 in the non-selected 4T μSAs and to thereby disable the non-selected 4T μSAs. As a result, by employing at least one additional transistor, namely, transistor 408, and by being operative to receive an additional control signal through the MWLb control input 420, 4T μSA 410 beneficially eliminates unwanted positive feedback paths on non-selected 4T μSAs in a given storage, sensing and data path circuit. However, this circuit technique does not completely address certain problems associated with positive feedback in the selected (i.e., active) 3T μSA (e.g., 110 in FIG. 2) or selected 4T μSA 410. Because transistor 408 is inserted between transistor 404 and VDD, transistor 408 is also adapted to enable the WRITE-1 operation.

FIG. 5 is a schematic diagram depicting at least a portion of a circuit 500 including an exemplary five transistor (5T) μSA (5T μSA) 510, according to another embodiment of the invention. The 5T μSA 510 can be beneficially utilized to minimize the impact of the most significant trigger of positive feedback in both selected and non-selected μSAs. To accomplish this, 5T μSA 510 preferably comprises a first NMOS transistor 502*a*, which may be a first READ transistor, and a second NMOS transistor 502*b*, which may be a second READ transistor. Transistors 502*a* and 502*b* may be employed in place of a single READ transistor (e.g., transistor 402 of the 4T μSA 410 shown in FIG. 4). First READ transistor 502*a* and second READ transistor 502*b* are preferably connected together in series to form a composite READ transistor. The 5T μSA 510 further comprises a first PMOS transistor 504, which may be a WRITE-1 transistor, a third NMOS transistor 506, which may be a WRITE-0 transistor, and a second PMOS transistor 508, which may be an ENABLE transistor, which function in a manner similar to WRITE-1 transistor 404, WRITE-0 transistor 406 and ENABLE transistor 408, respectively, in the 4T μSA 410 shown in FIG. 4.

More particularly, transistor 502*a* is configured having a source adapted for connection to a corresponding WBL 121, a drain connected to a source of transistor 502*b*, and a gate adapted for connection to a corresponding LBL 111. Transistor 502*b* includes a drain adapted for connection to a corresponding RBL 122, and a gate connected to the gate of transistor 502*a*. Transistors 504 and 506 are configured having drains connected to the gates of transistors 502*a* and 502*b*, a source of transistor 504 is connected to a drain of transistor 508, a gate of transistor 504 is connected to the drain of transistor 502*b*, a source of transistor 506 is adapted for connection to ground, or an alternative voltage return of the 5T μSA 510, and a gate of transistor 506 is connected to the source of transistor 502a. Transistor 508 includes a source adapted for connection to VDD, or an alternative voltage supply, and a gate forming a control input 520 of the 5T μSA 510, which may be coupled to a master word line, and being adapted to receive a control signal, MWLb, supplied to the control input.

As apparent from the figure, compared to the 4T μSA 410 shown in FIG. 4, the 5T μSA 510 includes an additional transistor, second READ transistor 502b, connected, in series with first READ transistor 502a, between WBL 121 and RBL 122. It should be noted that the composite READ transistor 502a, 502b does not reduce standby leakage current. During a standby mode of operation, the standby current through the composite READ transistor will be substantially zero since both RBL 122 and WBL 121 are precharged to the high voltage supply potential, VDD. In other words, there is no voltage difference in the standby state to drive a leakage current from RBL 122 to WBL 121 through the composite READ-transistor.

The 5T μSA configuration offers several advantages over other μSA arrangements. For example, during a READ-0 operation, WBL 121 is pulled to ground and RBL 122 is precharged high. Prior to the READ-0 operation, LBL 111 is precharged to a low voltage level (via transistor 506, which is turned on during standby). After precharge and just before a memory operation, the RBL is permitted to float at a high level. During READ-0 operation, LBL 111 remains approximately at the precharge voltage level after charge sharing with a memory cell (e.g., memory cell 112 shown in FIG. 3). For a successful READ-0 operation to occur, RBL 122 should remain high for a sufficient period of time (e.g., 100 s of picoseconds), even though RBL 122 typically leaks through the first READ transistor 502a and the second READ transistor 502b in all selected and non-selected 5T μSAs 510 coupled to a given pair of WBL and RBL. This leakage is typically caused by sub-threshold leakage.

In comparison to the 3T μSAs 110 (FIG. 2) and 4T μSAs 410 (FIG. 4), each of which employs a single READ transistor (202 and 402, respectively), utilizing two READ transistors, 502a and 502b, as in 5T μSA 510, advantageously decreases the leakage current during the sensing period from RBL 122, through the READ transistors 502a and 502b, to WBL 121 by a factor of, for example, about twenty. Significantly, the series READ transistors 502a and 502b mitigate leakage current flow through all selected and non-selected, parallel-connected 5T μSAs 510 coupled to a given pair of WBL 121 and RBL 122. Therefore, for the 5T μSA 510, RBL 122 will preferably remain high for a longer period of time than for either the 3T μSA (e.g., 110 in FIG. 2) or the 4T μSA (e.g., 410 in FIG. 4). Employing the series READ transistors 502a and 502b increases the robustness of the sensing circuitry by decreasing the likelihood of erroneous discharge of RBL 122, and by decreasing the likelihood of the engagement of positive feedback during the READ-0 operation.

Another advantage offered by the 5T μSA 510 circuit arrangement is that, since each 5T μSA coupled to RBL 122 has significantly lower leakage compared to 3T μSA or 4T μSA circuit configurations, the number of 5T μSAs that can be connected in parallel to a given RBL can be greater compared to the number of 3T or 4T μSAs, without sacrificing significant signal margin. More memory cells associated with the greater number of μSAs can share other requisite circuitry that connect from the RBL 122 through the memory's data path, for example, SSAs 120, TSAs 130 and write drivers 140 (FIG. 3). Sharing circuitry among more memory cells 112, can considerably improve the memory bit capacity per unit area (i.e., density).

By employing a 5T μSA circuit arrangement (e.g., 5T μSA 510), the number of memory cells 112 connected to a given 5T μSA 510 may be increased beyond that which is achievable using a 3T or 4T μSA circuit architecture (e.g., 110 shown in FIG. 2, or 410 shown in FIG. 4). In any μSA (e.g., 3T μSA 110, 4T μSA 410, or 5T μSA 510), increasing the number of memory cells coupled to a given LBL 111 will generally increase the load capacitance associated with the given LBL and dilute the signal margin. Since the 5T μSA has smaller noise margins, it can better resolve diluted signals and, hence, can detect state from a larger number of memory cells connected to a local bit line than the 4T μSA (memory capacity per unit area may be increased). Greater loading on the LBL 111 does, however, reduce the READ-1 performance because the time constant between a memory cell 112 and its corresponding LBL 111 will increase as a result of the additional load capacitance.

With continued reference to FIG. 5, during a READ-1 operation, the voltage potential on the LBL 111 must be raised above the threshold voltage of READ transistors 502a and 502b in order to discharge the corresponding RBL 122 and subsequently initiate positive feedback between the READ transistors 502a and 502b and WRITE-1 transistor 504. One way to minimize this performance penalty is to reduce the threshold voltage, $V_{th}$, of READ transistors 502a and 502b. Lowering $V_{th}$ of READ transistors 202 and 402 is not practical for 3T μSAs 110 (FIG. 2) and 4T μSAs 410 (FIG. 4), respectively, primarily because of an unacceptable increase in leakage that would erroneously discharge the corresponding RBL 111 to which the μSAs are coupled. However, implementing the READ transistor as a composite of two series-connected READ transistors between RBL 122 and WBL 121 decreases leakage dramatically in the 5T μSA 510; therefore, leakage on RBL 111 can be maintained within acceptable levels even if the threshold voltages of the READ transistors 502a and 502b are reduced.

Once positive feedback is initiated, in a very short time the READ-1 operation is completed. Therefore, even though the series connection of the READ transistors 502a and 502b in the 5T μSA 510 increases the resistance of the discharge path during the READ-1 operation, the performance penalty can be kept to acceptable levels by reducing threshold voltages and by utilizing positive feedback, as stated above.

Another benefit of the 5T μSA circuit configuration (e.g., 5T μSA 510) relates to a decrease in intrinsic variations of the composite READ transistor, for example, comprising transistors 502a and 502b, as compared to the intrinsic variations of the single READ transistor, for example, transistors 202 (FIG. 2) and 302 (FIG. 3). An intrinsic variation may be defined as a variation in one or more IC process characteristics of the transistor, such as, but not limited to, transistor threshold voltage.

The intrinsic variation of transistor threshold voltage is significantly less in the 5T μSA 510 for at least two reasons. One reason can be attributed to an allowed reduction in the threshold voltages of the individual READ transistors 502a and 502b, because a composite READ transistor comprising two series-connected transistors (e.g., 502a and 502b) having the same threshold voltage as a single READ transistor (e.g., transistors 202 or 302 shown in FIG. 2 or 4, respectively) exhibits less leakage current compared to a single READ transistor. The magnitude of the intrinsic threshold voltage variation is proportional to the square root of the threshold dopant implant used in forming the transistor(s). For the composite READ transistor, the threshold dopant implant will be less because the threshold voltage is less. Accordingly, decreasing the threshold voltage reduces the intrinsic threshold voltage variation of each READ transistor 502a and 502b, and thus reduces the intrinsic threshold variation of the composite READ transistor.

Another reason that the intrinsic variation of transistor threshold voltage is significantly less in the 5T μSA 510 is related to the doubling of the area under the gates of the composite READ transistor; that is, the channel area of the composite READ transistor in comparison to the channel area under the gate of a single READ transistor. Because the two transistors 502a and 502b forming the composite READ transistor are connected together in series in the 5T μSA 510 shown in FIG. 5, and because each transistor may, for example, have the same channel length and channel width as a single READ transistor 202 or 402 in the 3T μSA 110 or 4T μSA 410 shown in FIGS. 2 and 4, respectively, the area under the gates of the composite READ transistor will be double the area under the gate of the single READ transistor. Doubling of channel area in a MOS device reduces the variation in threshold voltage of the device by the square root of two. Thus, doubling the area under the gates reduces the intrinsic threshold voltage variation of the composite READ transistor by a factor of the square root of two.

Lower intrinsic threshold voltage variation for the composite READ transistor allows further lowering of the average, or target, threshold voltage of READ transistors 502a and 502b beyond the threshold voltage lowering associated with the advantages noted above. Because the intrinsic threshold voltage variation of the composite READ transistor is less than the intrinsic threshold voltage variation of the single READ transistor, the average threshold voltage of the composite READ transistor can be made lower than the average threshold voltage of the single READ transistor, while maintaining the same worst-case low threshold voltage. Maintaining the same worst-case low threshold voltage means that out of all the composite READ transistors within a given memory macro comprising a plurality of 5T μSAs 510, the composite READ transistor that has the lowest threshold voltage will statistically have the same threshold voltage as the single READ transistors 202 and 302, having the lowest threshold voltage within a memory comprising a plurality of 3T μSA 110 or 4T μSA 410, respectively. Furthermore, following the same line of reasoning, the worst-case maximum threshold voltage will be less for the composite READ transistor in a memory comprising 5T μSAs 510 than for the single READ transistor 202 and 402 within a memory comprising 3T μSAs 110 and 4T μSAs 410, respectively. As a result of reductions in threshold voltage fluctuations, the signal-to-noise margin of the 5T μSA 510 is greatly enhanced.

A primary purpose for using two READ transistors 502a and 502b in the 5T μSA 510, compared to a μSA circuit architecture employing a single READ transistor (e.g., 3T μSA 110 or 4T μSA 410) is not to reduce standby power but rather to improve the robustness and density of the eDRAM macro when considering PVT variations.

FIG. 6 is a schematic diagram depicting at least a portion of a circuit 600 including an exemplary 4T μSA 610, according to another embodiment of the invention. The 4T μSA 610 is similar to the 5T μSA 510 shown in FIG. 5, except that 4T μSA 610 does not include an ENABLE transistor (e.g., transistor 508 shown in FIG. 5). Specifically, like 5T μSA 510, 4T μSA 610 employs a composite READ transistor comprised of a first NMOS transistor 602a, which may be a first READ transistor, and a second NMOS transistor 602b, which may be a second READ transistor. A source of transistor 602a is adapted for connection to a corresponding WBL 121, a drain of transistor 602a is connected to a source of transistor 602b, a drain of transistor 602b is adapted for connection to a corresponding RBL 122, and gates of transistors 602a and 602b are adapted for connection to a corresponding LBL 111. The 4T μSA 610 further comprises a PMOS transistor 604, which may be a WRITE-1 transistor, having a source adapted for connection to voltage supply VDD, or an alternative supply voltage, a drain connected to the gates of transistors 602a and 602b, and a gate connected to the drain of transistor 602b; and a third NMOS transistor 606, which may be a WRITE-0 transistor, having a source adapted for connection to ground, or an alternative a voltage return of the circuit 610, a drain connected to the drain of transistor 604, and a gate connected to the source of transistor 602a.

As apparent from the figure, 4T μSA 610 does not employ an ENABLE transistor, and consequently does not require a control input adapted to receive a control signal (e.g., control signal MWLb supplied to control input 520 in the 5T μSA 510 shown in FIG. 5). Moreover, since the effect of positive feedback on the μSA is substantially reduced by decreasing RBL 122 leakage through the use of a composite READ transistor comprising transistors 602a and 602b, undesirable issues involving positive feedback erroneously discharging RBL 122 are sufficiently reduced.

Figure 7:
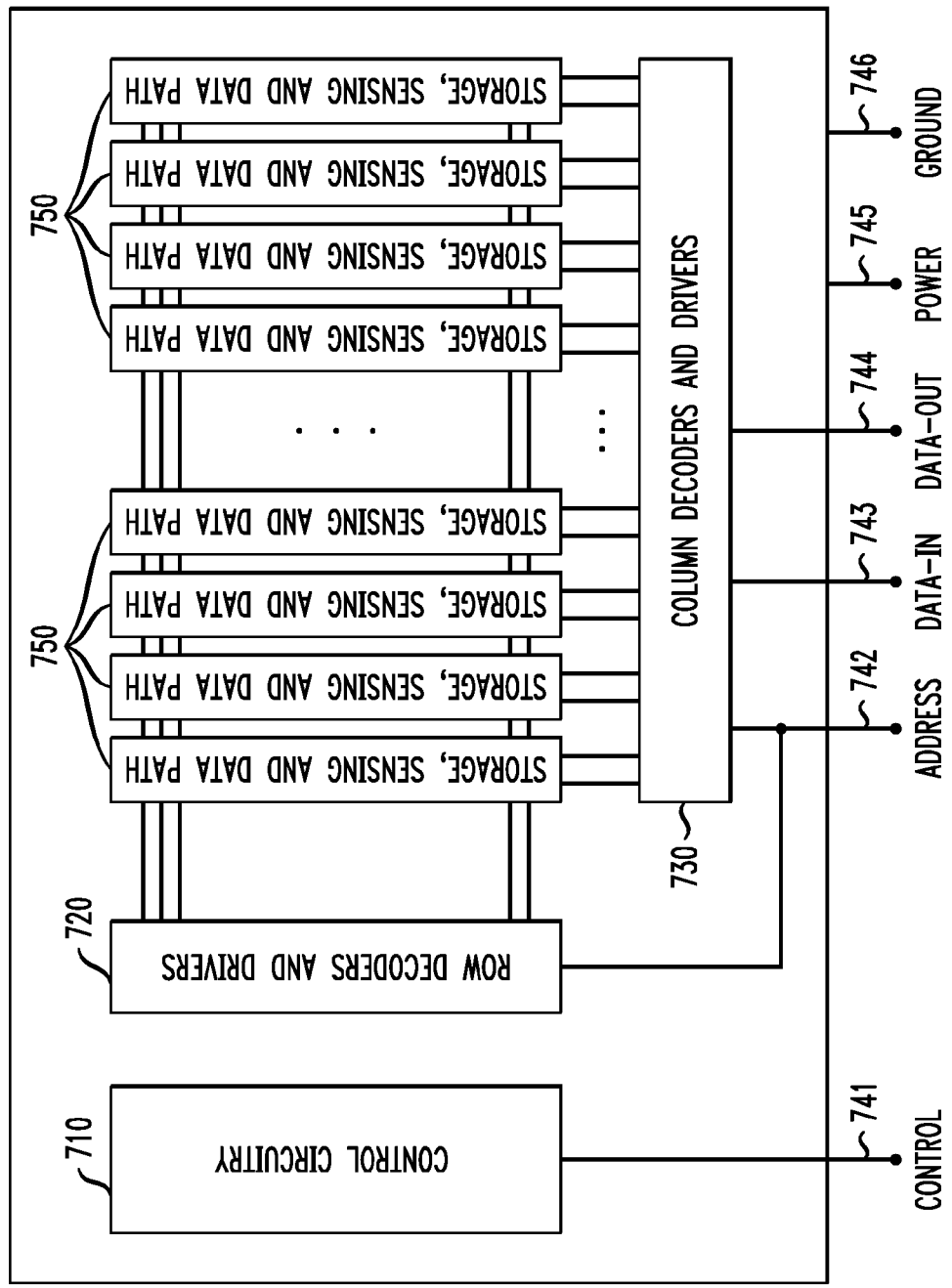
FIG. 7 is a block diagram depicting at least a portion of an exemplary memory macro, according to an embodiment of the present invention.

FIG. 7 is a block diagram depicting at least a portion of an exemplary memory macro 800, according to an embodiment of the invention. Memory macro 700 preferably includes control circuitry 710 operative to control prescribed functions in the memory macro (e.g., read and write operations, timing, etc.) as a function of one or more control signals 741 supplied to the memory macro. Memory macro 700 further includes row decoder and driver circuitry 720, column decoder and driver circuitry 730, and a plurality (e.g., 4096) of storage, sensing and data path circuits 750. One or more of the storage, sensing and data path circuits 750 preferably comprises at least one μSA according to an embodiment of the invention, such as, for example, μSAs 410, 510 or 610 shown in FIGS. 4, 5 and 6, respectively.

Row decoder and driver circuitry 720 and column decoder and driver circuitry 730 are preferably operative to access one selected row and one or more selected columns, respectively, of memory cells in each of the corresponding storage, sensing and data path circuits 750 coupled to the row and column circuitry, as a function of an address signal 742 supplied to the memory macro 700. Memory macro 700 is preferably further adapted to receive other control signals, including, for example, a Data-in signal 743, for supplying data to be written to the memory macro, and a data-out signal 744, for conveying data read from the memory macro. Power 745 and ground 746, or alternative voltages, are also supplied to the memory macro 700 for powering the memory macro. Memory macro 700 preferably employs single-ended sensing using a hierarchy of sense amplifiers. The initial data sensing may be performed using, for example, 4T μSAs 610 depicted in FIG. 6. As shown in FIG. 3 for the μSAs 310 and 312, multiple 4T μSAs 410 and 610 or 5T μSAs 510 may share the same RBL 122 and WBL 121 and are connected together in parallel. It is to be understood that the various memory and sense amplifier circuits depicted in the figures are merely illustrative, and that the present invention is not limited to the specific circuit arrangements shown.

Illustrative embodiments of the present invention employing an ENABLE transistor, such as, for example, transistor 408 in 4T μSA 410, or transistor 508 in 5T μSA 510, shown in FIGS. 4 and 5, respectively, advantageously improve immunity of the μSA to IC process variations. More particularly, positive feedback can be selectively controlled, in accordance with an aspect of the invention, by varying a timing of the control signal MWLb applied to the control input (e.g., 420 or 520) of the μSA, such as, for example, by controlling a time at which the control signal is enabled (i.e., becomes active). Such control of positive feedback can lessen the deleterious impact of process variations on the signal margins of 4T μSA 410 (in particular, transistor 408) and 5T μSA (in particular, transistor 508). With reference to FIG. 4, the purpose of WRITE-1 transistor 404 is to write a logic "1" into the selected memory cell substantially immediately upon access of the memory cell. ENABLE transistor 408 is inserted between the WRITE-1 transistor 404 and voltage supply VDD primarily for the purpose of disabling the erroneous positive feedback for unselected 5T μSAs during a READ-0 operation from a selected 5T μSA 410 coupled to the same pair of WBL 121 and RBL 122. However, ENABLE transistor 408 does not necessarily prevent the deleterious effects of positive feedback within the selected 5T μSA 410 while a read operation is being performed.

Figure 8:
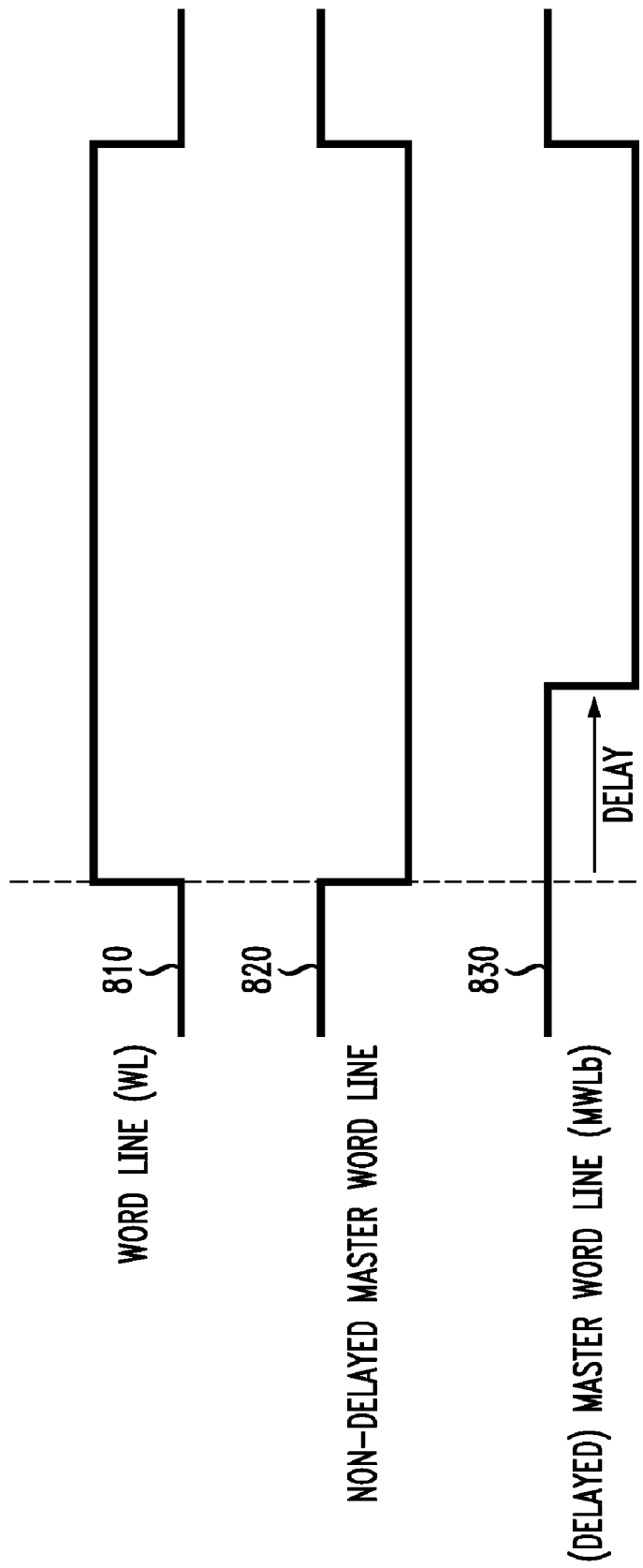
FIG. 8 shows an illustrative timing diagram of a word line signal and a master word line signal, according to an embodiment of the present invention.

To overcome this obstacle, FIG. 8 depicts a timing diagram 800 illustrating exemplary signals used for controlling certain functions in the sense amplifier, namely, a word line (WL) signal 810, a non-delayed master word line signal 820, and a delayed master word line signal (MWLb) 830, according to an embodiment of the invention. Specifically, the non-delayed master word line signal 820 is preferably asserted at substantially the same time as the word line (WL) signal 810 is asserted. Without this timing condition, the non-delayed master word line signal 820 would be coupled to the MWLb control input (e.g., 420 in FIG. 4 and 520 in FIG. 5). The WL signal 810 is preferably asserted on the rising edge of the waveform of the WL signal 810. The non-delayed master word line signal 820 is preferably asserted on the falling edge of the waveform of the non-delayed master word line signal 820.

The assertion of non-delayed master word line signal 820, as represented by the falling edge of signal 820 in this illustrative embodiment, is delayed by a prescribed amount of time to form the assertion (e.g., falling edge) of the delayed master word line (MWLb) signal 830 (e.g., after the RBL falls to a logic low for a typical READ-1 operation). It is to be appreciated that, in alternative embodiments, assertion of the non-delayed master word line signal 820 may be represented by the rising edge of the signal 820. Moreover, it is not necessary that an assertion polarity (e.g., rising or falling edge) of the MWLb signal 830 be the same as that of the non-delayed master word line signal 820. The rising edge (i.e., non-assertion) of the MWLb signal 830 may be substantially coincident with the rising edge of the non-delayed master word line signal 820. The MWLb signal 830 may be coupled to the MWLb control input 420 of the selected 5T μSA 410.

One purpose of the delay in the MWLb signal 830 is to selectively postpone enabling of ENABLE transistor 408 or 508, and the associated positive feedback, until the read operation is complete in the 5T μSA 410 and the read data has been transferred to the secondary sense amplifier (e.g., SSA 120 shown in FIG. 3). Once the read operation has been completed, the transistor network comprising transistors 404 and 408 (see FIG. 4) can be enabled for a restore or a WRITE-1 operation.

In a similar manner that the MWLb signal 830, shown in FIG. 8, is coupled to the MWLb control input 420 and is used by the 5T μSA 410 shown in FIG. 4, in another embodiment, MWLb signal 830 is coupled to the MWLb control input 420, and is used by the 4T μSA 310 (FIG. 3).

Using the MWLb signal 830 with the timing shown in FIG. 8, the robustness of 4T μSA 410 and 5T μSA 510 can be improved significantly since the erroneous positive feedback is eliminated entirely both in active and non-active 4T μSA 410 and 5TμSAs 510. The timing shown in FIG. 8 provides a longer and more robust sensing time window for signal transfer from the memory cell to the LBL 111. The disadvantage of the timing shown in FIG. 8 is the reduction of the write window. The write window, however, can be expanded, for example, by increasing the DRAM cycle time.

Figure 9:
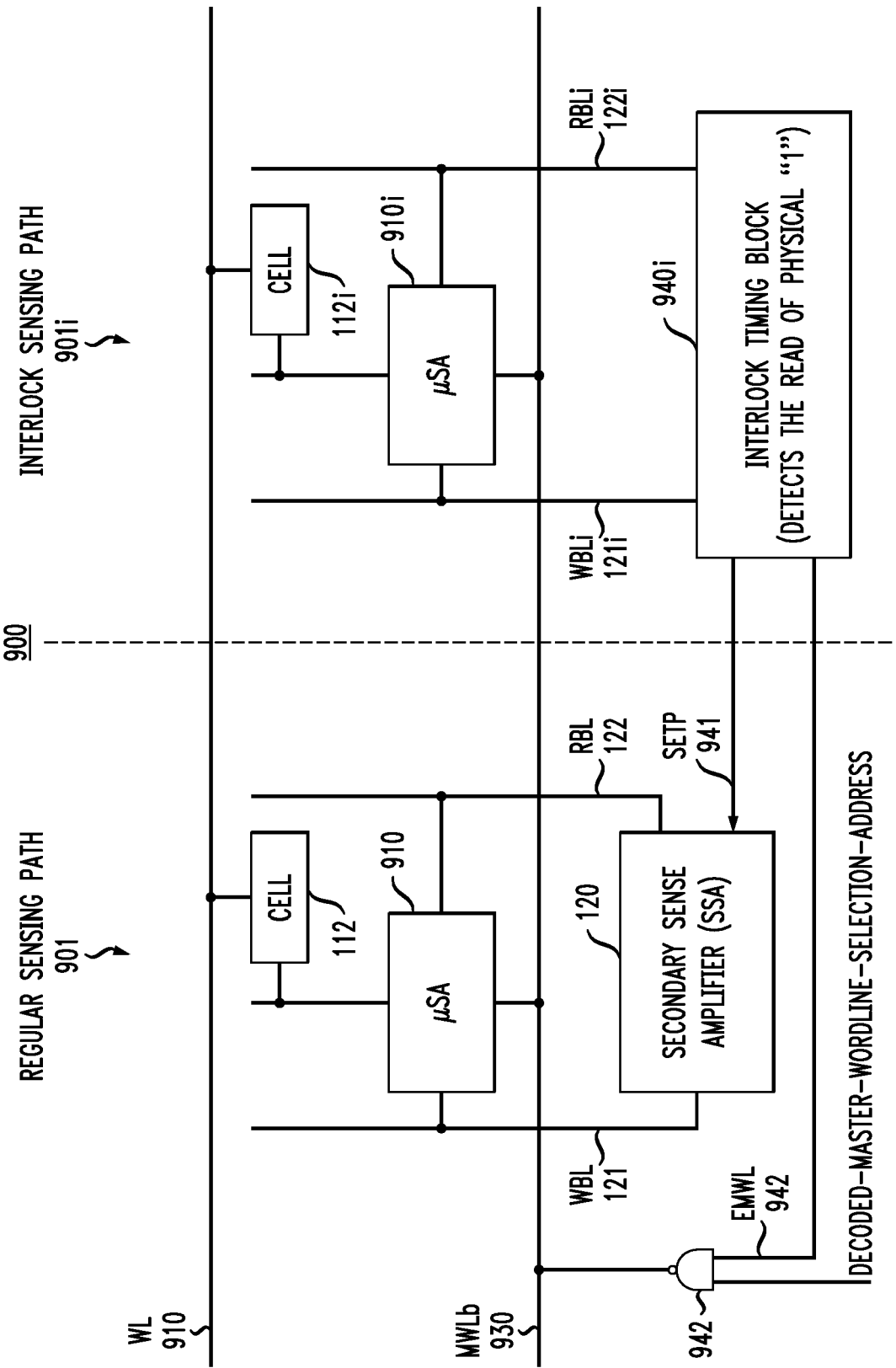
FIG. 9 shows an exemplary self-timed circuit for generating a timing of a master word line signal, according to an embodiment of the invention.

FIG. 9 shows an embodiment of a self-timed circuit 900 for generating the timing of the master word line MWLb signal 830 (see FIG. 8). Self timed circuit 900 may comprise a plurality of regular sensing paths 901, although only one regular sensing path is shown, and one or more interlock sensing paths 901i, although only one interlock sensing path is shown. The sensing path 901 may be the same as or similar to the storage, sensing and data path circuit 100 or 300 previously described. With this self timed circuit 900, MWLb runner 930 may be enabled close in time to the completion of a physical READ-1 operation within the interlock sensing path 901i, and optionally before latching the secondary sense amplifiers 120.

MWLb runner 930 is preferably broadly defined herein as a connection (e.g., a bus or alternative conductor) that conveys the MWLb signal (e.g., 830 in FIG. 8) to the respective control inputs (e.g., 420 or 510 in FIG. 4 or 5, respectively) on the μSAs 910 and 910i. Self-timed circuit 900 is an exemplary implementation for generating such a timing sequence. It comprises memory cells and associated μSAs divided into two categories: namely, those in the regular sensing path 901, and those in the interlock sensing path 901i. The regular sensing path 901 comprises memory cells 112, read bit lines 122, write bit lines 121, μSAs 910, SSAs 120 and, although not shown in FIG. 9, optionally, TSAs 130 (see FIG. 1). The interlock sensing path 901i comprises interlock memory cells 112i, interlock read bit lines 122i, interlock write bit lines 121i, μSAs 910i, and interlock timing block 940i that detects the read of a physical "1" state (i.e., READ-1).

Preferably, interlock memory cells 112i, interlock read bit lines, 122i interlock write bit lines 121i, and interlock μSAs 910i are substantially identical to memory cells 112, read bit lines 122, write bit lines 121 and μSAs 910. It is to be understood that such functional blocks in the regular sensing path 901 need not be identical to corresponding functional blocks in the interlock sensing path 901i. μSAs 910 and μSAs 910i comprise, for example, the 4T μSAs 410 or the 5T μSAs 510 depicted in FIGS. 4 and 5, respectively. Memory cells 112 are adapted to store both data states. Read bit lines 122 and write bit lines 121 typically outnumber the interlock read bit lines 122i and interlock write bit lines by a factor of, for example, fifty. The interlock memory cells 112i store a predefined state; in this embodiment the predefined state is a "1" data state.

The activation of interlock memory cells 112i by word line 910 triggers the discharge of read bit line RBLi 122i. Given that memory cells 112 and interlock memory cells 112i are connected to a common word line 910 driven by a word line (WL) signal (e.g., 810 in FIG. 8), the discharge of interlock RBL 122i indicates when a physical "1" stored in memory cells 112 would discharge RBL 122. In fact, the discharge time of RBL 122 and interlock RBL 122i would be identical if it were not for the intrinsic process differences among the memory cells 112, μSAs 910, interlock memory cells 112i, and interlock μSA s 910i. Even considering these differences, the discharge time of interlock RBL 122i may serve as a reference point in time for the discharge time the RBL 121. Moreover, averaging of multiple interlock memory cells 112i and interlock μSAs 910i can be employed to reduce the impact of intrinsic device mismatch within the interlock sensing path 901i and, hence, improve the overall tracking of the reference timing generated.

Once the interlock sensing path 901i detects the discharge of the interlock read bit line RBL 122i, the interlock sensing path 901i generates two timing signals; SETP 941 and EMWL 942 (enable master word line). SETP 941 triggers the secondary sense amplifier 120 after all RBL 122 have completed the READ-1 operation. EMWL 942 triggers the assertion of MWLb 930 to enable, if required, a physical WRITE-1 operation for all active cells, associated with the selected WL 910. Therefore, the self-timed circuit 900 provides a self-timed reference for enabling MWLb signal 830, MWLb runner 930, and MWLb terminals 420 (and 520) after a delay from the rising edge of the WL signal 810 and the word line 910.

Figure 10:
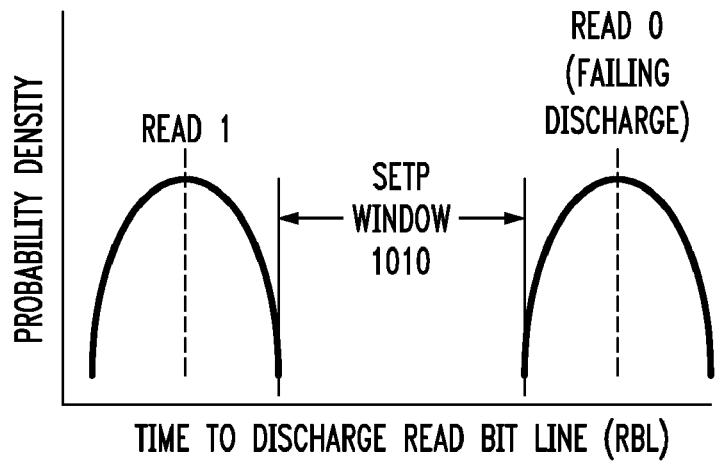
FIG. 10 is an illustrative conceptual representation of two memory cell populations under process variation, stored "0" data states and stored "1" data states, according to an embodiment of the invention.

FIG. 10 is an illustrative conceptual representation 1000 of two memory cell populations (under process variations), namely, those that store "0s" and those that store "1s." FIG. 10 illustrates the discharge of the RBL 122 from high voltage (e.g., VDD) for memory cells 112 capable of storing either data state. The memory cells 112 storing a physical "1" tend to discharge the RBL 122 rapidly. Variation in the time to discharge the RBL 122 for a given cell 112 storing a "1" occurs due, at least in part, to the aforementioned variations in the μSA and variations in the memory cell 112 characteristics. Ideally, memory cells 112 storing a physical "0" should never discharge RBL 122. However, due to intrinsic variations and leakage current, among other factors, memory cells storing a physical "0," given enough time, will discharge the corresponding RBL 122.

With continued reference to FIG. 10, the SETP window 1010 defines the time period during which the respective states of the memory cells can be detected on the RBL 122, for the entire useful population of cells. A wide SETP window 1010 indicates a robust design from a signal-to-noise margin perspective. A negative SETP window 1010 indicates that the configuration of memory cells 112 and μSAs do not have adequate margin to identify physical "1s" and physical "0s" from a general population of memory cells storing both states. Aspects of the invention beneficially widen the SETP window 1010.

Figure 11:
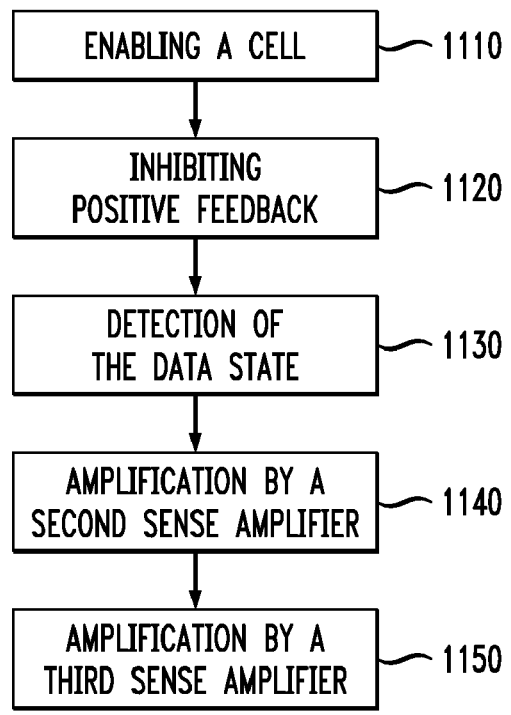
FIG. 11 illustrates steps in an exemplary method for sensing data, according to an embodiment of the invention.

FIG. 11 illustrates steps of a method for sensing data 1100, according to an exemplary embodiment of the invention. A first step 1110 is to enable, or turn on, a memory cell 112 by asserting WL signal 810. WL signal 810 is coupled to memory cell 112 and is adapted to enable memory cell 112 by, for example, by coupling the charge in memory cell 112 to LBL 111. Enabling memory cell 112 transfers the data stored in memory cell 112 onto LBL 111 where it is detected by μSAs 410 (or 510). Prior to the first step 1110, it is assumed that LBL 111 was precharged to a prescribed precharge voltage level, for example, approximately 0 volts. For a READ-0 operation, the data stored in cell 112 is a "0" data state, and the potential on LBL 111, after WL signal 810 has been asserted, remains approximately at the precharge voltage level, that is, at approximately zero volts.

A second step 1120 in the illustrative data sensing method 1100 is to delay triggering (i.e., inhibiting) the positive feedback within μSA 410 (or 510) so as to reduce the likelihood that the positive feedback erroneously raises the potential on LBL 111. One or more of ENABLE transistors 408 and 508, MWLb signal 830, and the composite READ transistor can be used to inhibit positive feedback as described herein with reference to FIGS. 3 through 9.

A third step 1130 in method 1100 involves detecting the data state—in this example, a "0" data state—by μSAs 410 and 510, as described herein with reference to FIGS. 1 through 9. The detected data state is coupled to RBL 112 for coupling to SSA 120 and TSA 130.

Fourth and fifth steps 1140 and 1150, respectively, in method 110 involve a transfer of the signal on RBL 122 by SSA 120 and subsequently amplification of the signal by TSA 130, respectively.

Figure 12:
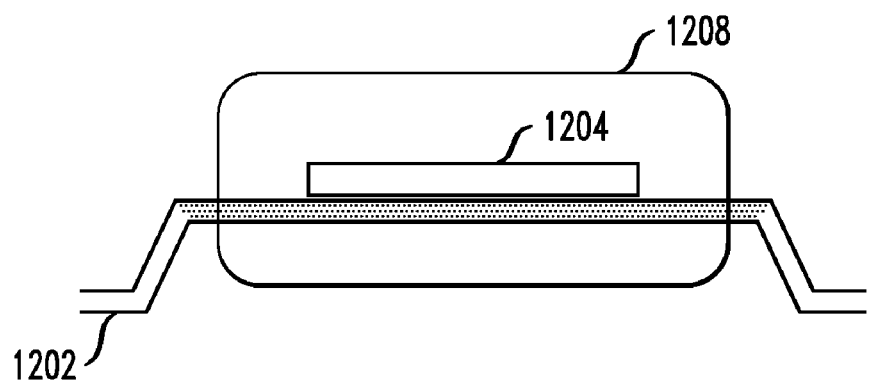
FIG. 12 is a cross-sectional view depicting an exemplary packaged integrated circuit comprising a storage, sensing and data path circuit, according to an embodiment of the invention.

FIG. 12 illustrates an integrated circuit, formed according to a method of the invention and/or comprising an apparatus of the invention. At least a portion of the techniques of the present invention may be implemented in the form of an integrated circuit. In forming integrated circuits, die are typically fabricated in a repeated pattern on a surface of a semiconductor wafer. Individual chip die are cut or diced from the wafer, then packaged as integrated circuits.

With reference to FIG. 12, a cross-sectional view depicting an exemplary packaged integrated circuit 1200 is shown, according to an embodiment of the present invention. The packaged integrated circuit 1200 comprises a substrate or leadframe 1202, a chip die 1204, and a molded encapsulation 1208. The chip die 1204 comprises a memory macro in accordance with the invention, for example, a memory macro 800 comprising μSAs 610 and interlock sensing circuit 901i, or for another example, a memory macro 800 comprising 4T μSAs 410, 5T μSAs 510, or second 4T μSAs 610. One skilled in the art would know how to dice wafers to produce integrated circuits. Integrated circuits so manufactured are considered part of this invention. Although FIG. 12 shows only one type of integrated circuit package, the invention is not so limited; the invention may comprise an integrated circuit die enclosed in any package type.

An integrated circuit in accordance with the present invention can be employed in any application and/or electronic system. Suitable systems for implementing the invention may include, but are not limited to, personal computers, communication networks, electronic commerce systems, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Figure 13:
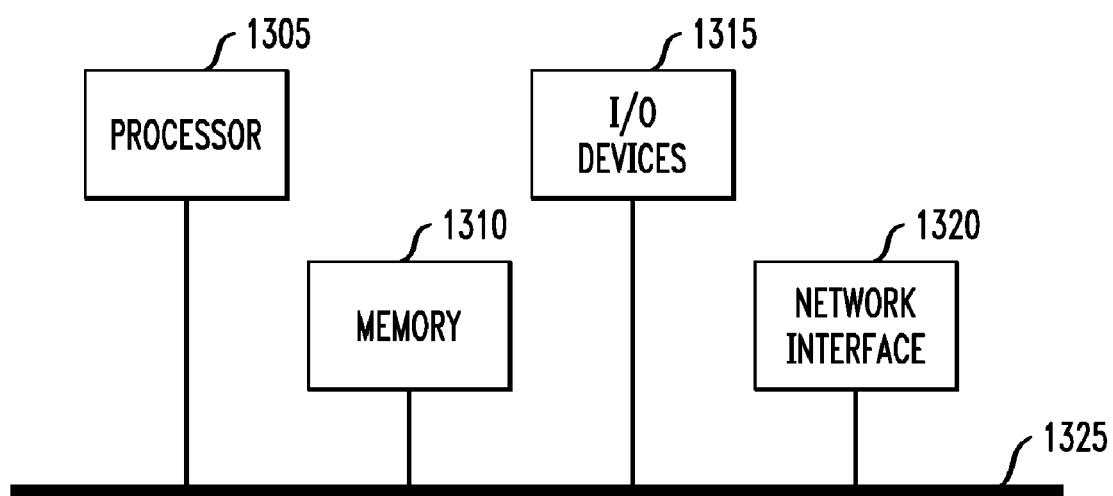
FIG. 13 illustrates an exemplary computer system in which one or more components and/or steps of the invention may be implemented, according to an embodiment of the invention.

Lastly, FIG. 13 illustrates a computer system in accordance with which one or more components/steps of the techniques of the invention may be implemented, for example, the components/steps depicted in FIGS. 1-12. It is to be further understood that the individual components may be implemented on one or more such computer system. In the case of an implementation on a distributed computing system, the individual computer systems and/or devices may be connected via a suitable network, e.g., cellular phone network, the Internet, the World Wide Web, private network, or local network. The invention is not limited to any particular network.

Thus, the computer system shown in FIG. 13 may represent one or more servers, mobile or stationary computing devices, one or more other processing devices, or one or more memory devices capable of providing all or portions of the functions described herein. The computer system may generally include a processor 1305, memory 1310, input/output (I/O) devices 1315, and network interface 1320, coupled via a computer bus 1325.

It is to be appreciated that the term "processor" as used herein is intended to include any processing device, such as, for example, one that includes a central processing unit (CPU) and/or other processing circuitry. It is also to be understood that the term "processor" may refer to more than one processing device and that various elements associated with a processing device may be shared by other processing devices. Processors may include memory, for example, cache memory.

The term "memory" as used herein includes memory embedded within a processor, an I/O device, and a network interface, for example, a cache memory within a processor. Memory may be embedded within an integrated circuit having other functions, for example, a processor chip with embedded memory. Alternately, memory may be within an integrated circuit functioning mainly as a memory integrated circuit. The term "memory" as used herein is intended to also include memory associated with a processor or CPU, such as, for example, random access memory (RAM), read only memory (ROM), a fixed memory device (e.g., hard disk drive), a removable memory device (e.g., diskette, compact disk, digital video disk or flash memory module), flash memory, non-volatile memory, etc. The memory may be considered a computer readable storage medium. At least one memory is formed in accordance with one or more components/steps of the techniques of the invention, for example, memory comprising µSA 510 (FIG. 5) or MWLb signal 830 (FIG. 8).

In addition, the phrase "input/output devices" or "I/O devices" as used herein is intended to include, for example, one or more input devices (e.g., keyboard, mouse, camera, etc.) for entering data to the processing unit, and/or one or more output devices (e.g., display, etc.) for presenting results associated with the processing unit.

Still further, the phrase "network interface" as used herein is intended to include, for example, one or more transceivers to permit the computer system to communicate with another computer system via an appropriate communications protocol.

Although embodiments of the invention have been described in a data path environment comprising three sense amplifiers, the µSA 610, the SSA 120, and the TSA 130, the invention is not so limited. The invention is useful and applicable to environments having one or more sense amplifiers in the data path, for example, a single sense amplifier arrangement comprising µSA 610, or a dual sense amplifier arrangement comprising µSA 610 and SSA 120. The term local bit line has been used to indicate the bit line coupling cells 112 to µSA 610. It is to be understood that other terms, such as bit line, column or local column, may be used synonymously with the term local bit line and couple cells 112 to µSA 610.

Although embodiments of the invention have transistors shown in the figures to be specifically N-channel or P-channel, the invention is not so limited. The invention may replace some or all transistors with transistors of the opposite type. Likewise power supply polarities and voltages, as well as data states may be changed in other embodiments of the invention.

Embodiments of the invention comprising DRAM memory cells have been illustrated and described. The invention, however, is not so limited. The invention may comprise other types of memory cells, for example, static random access memory (SRAM), read only memory (ROM), FLASH, ferroelectric RAM (FeRAM), fuse memory, anti-fuse memory, and other volatile and non-volatile memory.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A circuit for sensing data states of respective memory cells in a memory array, the memory array including at least a first bit line coupled to at least a subset of the memory cells, the circuit comprising:
   at least one sense amplifier coupled to the first bit line, the at least one sense amplifier comprising a first transistor operative to selectively inhibit charging of the first bit line in a manner which is independent of a voltage level on a second bit line coupled to the at least one sense amplifier,
   wherein the first transistor comprises a first source/drain adapted for connection to a first voltage supply, and a gate adapted to receive a first control signal, wherein assertion of the first control signal is delayed from assertion of a word line signal corresponding to the selected memory cell, and wherein the word line signal is supplied to at least one of the memory cells.

2. The circuit of claim 1, wherein the first control signal is generated by at least one interlock sensing path, wherein the interlock sensing path comprises at least one interlock memory cell, an interlock sense amplifier, an interlock first bit line, an interlock second bit line, an interlock third bit line, and an interlock timing circuit, wherein the word line signal is coupled to the at least one interlock memory cell, wherein the interlock timing circuit is coupled to the interlock third bit line, the interlock timing circuit being operative to detect a first data state also detected by the interlock sense amplifier, wherein the first data state is stored in the at least one interlock memory cell, wherein the interlock timing circuit is operative to generate a second control signal indicating that the interlock timing circuit has detected the first data state, wherein the interlock sense amplifier is coupled to the interlock first bit line, the interlock second bit line and the interlock third bit line, wherein the interlock first bit line is coupled to the at least one interlock memory cell, and wherein the delayed signal is generated as a function of the second control signal.

3. The circuit of claim 1, wherein the first transistor is further operative to enable writing of a first data state to at least one of the memory cells.

4. A circuit for sensing data states of respective memory cells in a memory array, the memory array including at least a first bit line coupled to at least a subset of the memory cells, the circuit comprising:
   at least one sense amplifier coupled to the first bit line, the at least one sense amplifier comprising a first transistor operative to selectively inhibit charging of the first bit line in a manner which is independent of a voltage level on a second bit line coupled to the at least one sense amplifier,
   wherein the at least one sense amplifier further comprises: a second transistor operative to enable a read operation of one of a first data state and a second data state, wherein the second data state is different from the first data state; a third transistor operative to enable a write operation of the first data state; and a fourth transistor operative to enable a write operation of the second data state.

5. The circuit of claim 4, wherein the first transistor comprises a gate adapted to receive a first control signal, a first source/drain adapted for connection to a first power supply, and a second source/drain, the second transistor comprises a gate adapted for connection to the first bit line, a first source/drain adapted for connection to a third bit line, and a second source/drain adapted for connection to the second bit line, the third transistor comprises a gate connected to the first source/drain of the second transistor, a first source/drain adapted for connection to a second power supply, and a second source/drain connected to the gate of the second transistor, the fourth transistor comprises a gate connected to the second source/drain of the second transistor, a first source/drain connected to the second source/drain of the first transistor, and a second source/drain connected to the gate of the second transistor, the circuit being operative to selectively inhibit charging of the first bit line as a function of the first control signal.

6. The circuit of claim 5, wherein assertion of the first control signal is delayed from assertion of a word line signal corresponding to the selected memory cell, wherein the word line signal is coupled to at least one of the plurality of memory cells.

7. The circuit of claim 6, wherein the first bit line comprises a local bit line, the second bit line comprises a read bit line, and the third bit line comprises a write bit line.

8. The circuit of claim 6, wherein the first power supply is at a first voltage level and the second power supply is at a second voltage level, the first voltage level being greater than the second voltage level, and wherein the precharge voltage level is at substantially the second voltage level.

9. The circuit of claim 5, wherein the second transistor is formed as a composite of at least two transistors coupled together in series.

10. A circuit for sensing data states of respective memory cells in a memory array, the memory array including at least a first bit line coupled to at least a subset of the memory cells, the circuit comprising:
at least one sense amplifier coupled to the first bit line, the at least one sense amplifier comprising a first transistor operative to selectively inhibit char in of the first bit line in a manner which is independent of a voltage level on a second bit line coupled to the at least one sense amplifier, wherein the at least one sense amplifier further comprises second and third transistors coupled together in series between a second bit line and a third bit line in the memory array and being operative to enable a read operation of a selected one of the memory cells, the second and third transistors being further operative to inhibit leakage current from the second bit line to the third bit line during a read operation.

11. The circuit of claim 10, wherein the at least one sense amplifier further comprises fourth and fifth transistors, wherein the first transistor comprises a gate adapted to receive a first control signal, a first source/drain adapted for connection to a first power supply, and a second source/drain, the second transistor comprises a gate adapted for connection to the first bit line, a first source/drain adapted for connection to the third bit line, and a second source/drain, the third transistor comprises a gate connected to the gate of the second transistor, a first source/drain connected to the second source/drain of the second transistor, and a second source/drain adapted for connection to the second bit line, the fourth transistor comprises a gate connected to the first source/drain of the second transistor, a first source/drain adapted for connection to a second power supply, and a second source/drain connected to the gates of the second and third transistors, the fifth transistor comprises a gate connected to the second source/drain of the third transistor, a first source/drain connected to the second source/drain of the first transistor, and a second source/drain connected to the gates of the second and third transistors, the circuit being operative to selectively inhibit charging of the first bit line as a function of the first control signal.

12. A circuit for sensing data states of respective memory cells in a memory array, the memory array including at least a first bit line coupled to at least a subset of the memory cells, the circuit comprising:
at least one sense amplifier coupled to the first bit line and to second and third bit lines in the memory array, the at least one sense amplifier comprising at least first and second transistors coupled together in series between the second and third bit lines and being operative to enable a read operation of a selected one of the memory cells, the first and second transistors being further operative to inhibit leakage current from flowing between the second and third bit lines during a read operation.

13. The circuit of claim 12, wherein the first transistor includes a gate adapted for connection to the first bit line, a first source/drain connected to a first source/drain of the second transistor, and a second source/drain adapted for connection to the second bit line, and the second transistor includes a gate connected to the gate of the first transistor and a second source/drain adapted for connection to the third bit line.

14. The circuit of claim 12, wherein the at least first sense amplifier further comprises third and fourth transistors, the first transistor including a gate adapted for connection to the first bit line, a first source/drain connected to a first source/drain of the second transistor, and a second source/drain adapted for connection to the second bit line, the second transistor including a gate connected to the gate of the first transistor and a second source/drain adapted for connection to the third bit line, the third transistor including a gate connected to the second source/drain of the first transistor, a first source/drain adapted for connection to a first voltage supply, and a second source/drain connected to the gates of the first and second transistors, and the fourth transistor including a gate connected to the second source/drain of the third transistor, a first source/drain adapted for connection to a second voltage supply, and a second source/drain connected to the gates of the first and second transistors.

15. The circuit of claim 14, wherein the third transistor is operative to enable writing of a first data state to at least a given one of the memory cells, and the fourth transistor is operative to enable writing of a second data state to the given one of the memory cells.

16. The circuit of claim 14, wherein the at least first sense amplifier further comprises a fifth transistor coupled between the third transistor and the first voltage supply, the fifth transistor being operative to selectively inhibit charging of the first bit line in a manner which is independent of a voltage level on the second bit line.

17. The circuit of claim 12, wherein the first bit line comprises a local bit line, the second bit line comprises a read bit line, and the third bit line comprises a write bit line.

18. The circuit of claim 12, wherein the at least one sense amplifier further comprises a third transistor operative to selectively inhibit charging of the first bit line in a manner which is independent of a voltage level on the second bit line.

19. The circuit of claim 18, wherein the first transistor includes a gate adapted for connection to the first bit line, a first source/drain connected to a first source/drain of the second transistor, and a second source/drain adapted for connection to the second bit line, the second transistor includes a gate connected to the gate of the first transistor and a second source/drain adapted for connection to the third bit line, and the third transistor includes a first source/drain adapted for connection to a first voltage supply, and a gate adapted to receive a first control signal, wherein assertion of the first control signal is delayed from assertion of a word line signal corresponding to the selected memory cell, and wherein the word line signal is supplied to at least one of the memory cells.

20. The circuit of claim 19, wherein the first control signal is generated by at least one interlock sensing path, wherein the interlock sensing path comprises at least one interlock memory cell, an interlock sense amplifier, an interlock first bit line, an interlock second bit line, an interlock third bit line, and an interlock timing circuit, wherein the word line signal is coupled to the at least one interlock memory cell, wherein the interlock timing circuit is coupled to the interlock third bit line, the interlock timing circuit being operative to detect a first data state detected concurrently by the interlock sense amplifier, wherein the first data state is stored in the at least one interlock memory cell, wherein the interlock timing circuit is operative to generate a second control signal indicating that the interlock timing circuit has detected the first data state, wherein the interlock sense amplifier is coupled to the interlock first bit line, the interlock second bit line and the interlock third bit line, wherein the interlock first bit line is coupled to the at least one interlock memory cell, and wherein the first control signal is generated as a function of the second control signal.

21. A method for sensing data states of respective memory cells in a memory array, the memory array including at least a first bit line coupled to at least a subset of the memory cells, the method comprising the steps of:
   enabling a given one of the memory cells by asserting a word line coupled to the given memory cell, wherein the given memory cell is coupled to the first bit line and to at least a first sense amplifier;
   inhibiting charging of the first bit line in a manner which is independent of a voltage level on a second bit line coupled to the at least one sense amplifier; and
   activating the at least one sense amplifier to detect a data state of the given memory cell,
   wherein the step of inhibiting charging of the first bit line comprises generating a control signal, wherein assertion of the control signal is delayed from assertion of the word line signal corresponding to the given memory cell.

22. An integrated circuit including at least one circuit for sensing data states of respective memory cells in a memory array, the memory array including at least a first bit line coupled to at least a subset of the memory cells, the at least one circuit comprising:
   at least one sense amplifier coupled to the first bit line, the at least one sense amplifier comprising a first transistor operative to selectively inhibit charging of the first bit line in a manner which is independent of a voltage level on a second bit line coupled to the at least one sense amplifier,
   wherein the first transistor comprises a first source/drain adapted for connection to a first voltage supply, and a gate adapted to receive a first control signal, wherein assertion of the first control signal is delayed from assertion of a word line signal corresponding to the selected memory cell, and wherein the word line signal is supplied to at least one of the memory cells.

* * * * *